United States Patent [19]
Harris et al.

[11] 3,961,100
[45] June 1, 1976

[54] METHOD FOR DEVELOPING ELECTRON BEAM SENSITIVE RESIST FILMS

[75] Inventors: David Isaac Harris, Kendall Park; Loren Bainum Johnston, Princeton, both of N.J.

[73] Assignee: RCA Corporation, New York, N.Y.

[22] Filed: Sept. 16, 1974

[21] Appl. No.: 506,445

[52] U.S. Cl. ................................... 427/43; 96/35; 96/36; 96/49; 96/91 D; 427/335; 156/13; 156/17
[51] Int. Cl.² ..................... B05D 3/06; G03F 1/02
[58] Field of Search .......... 96/27 R, 49, 35.1, 36, 96/91 D, 35; 156/13, 17; 427/43, 335; 346/74 E, 74 CR

[56] References Cited
UNITED STATES PATENTS

| | | | |
|---|---|---|---|
| 2,911,299 | 11/1959 | Baril et al. | 96/49 |
| 3,264,104 | 8/1966 | Reichel | 96/91 D |
| 3,639,185 | 2/1972 | Colom | 96/36 |
| 3,649,393 | 3/1972 | Hatzakis | 156/13 |
| 3,707,373 | 12/1972 | Martinson et al. | 96/35.1 |
| 3,779,774 | 12/1973 | Cope et al. | 96/91 D |
| 3,841,874 | 10/1974 | Nishino | 96/49 |
| 3,850,633 | 12/1974 | Ross et al. | 96/27 H |
| 3,850,733 | 11/1974 | Morau et al. | 96/274 |

OTHER PUBLICATIONS

Cortellino et al., "IBM Technical Disclosure Bulletin," vol. 15, No. 1, 6/1972, p. 174.

Primary Examiner—Charles L. Bowers, Jr.
Attorney, Agent, or Firm—Glenn H. Bruestle; Birgit E. Morris

[57] ABSTRACT

The effective sensitivity of a photo- or electron beam resist is improved by contacting the resist film with developer solution and water prior to exposure.

3 Claims, 1 Drawing Figure

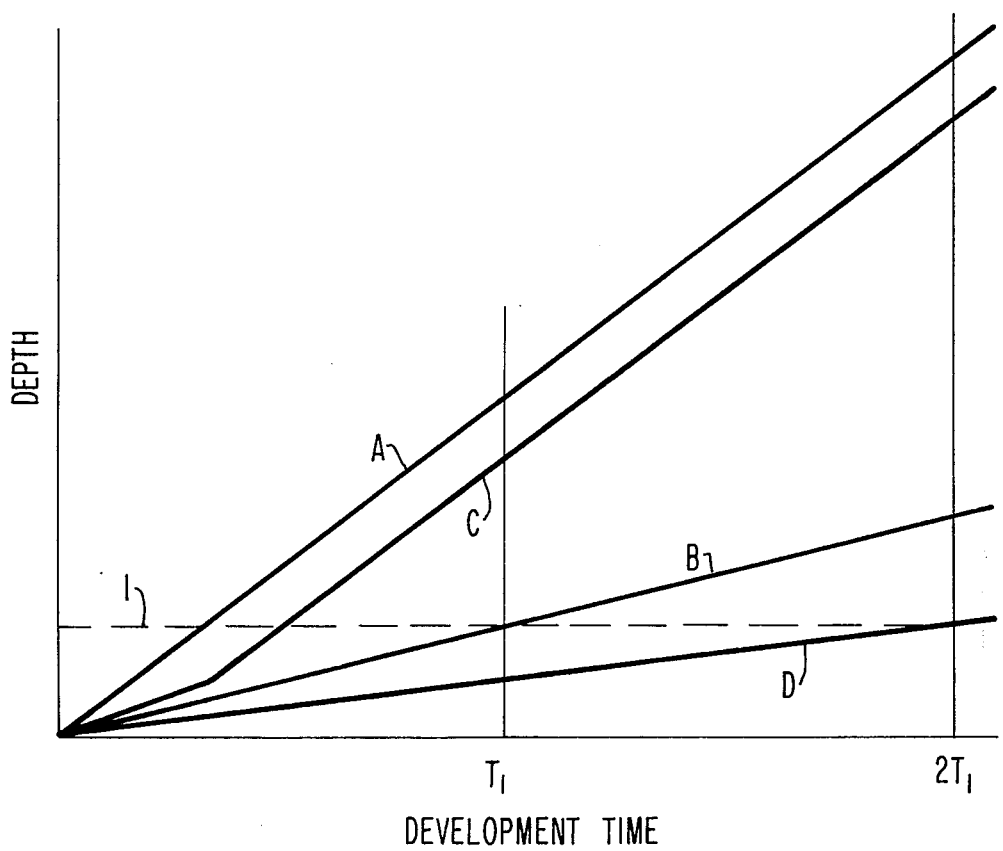

METHOD FOR DEVELOPING ELECTRON BEAM SENSITIVE RESIST FILMS

This invention relates to an improved method of developing films of positive resists. More particularly, this invention relates to a multistaged development for positive photo- and/or electron beam-sensitive resist films which reduces the dissolution rate of unexposed resist and improves the effective sensitivity of the exposed resist.

CROSS REFERENCE TO RELATED APPLICATIONS

This application discloses subject matter that is similar to copending application of Barton, "Process for Improved Development of Electron Beam-sensitive Resist Films" Ser. No. 506,444 filed concurrently herewith.

BACKGROUND OF THE INVENTION

Resists are herein defined as materials which change their solubility to a developer solution upon exposure to light or electron beams. Thus a differential solubility rate between exposed and unexposed portions of a resist film results in the formation of a surface relief pattern after development. Such resists have long been employed in the photolithography art and, more recently, sensitive resists have been used in the preparation of microminiature circuit patterns or other very small information-containing patterns such as holographic patterns.

Photoresists or electron beam-sensitive resists which become more soluble in the exposed regions are known as positive resists and those that become less soluble on exposure are known as negative resists. However, this change in solubility is only a relative change and during solvent development even the less soluble, unexposed portions of the resist dissolve in the developer solvent to some extent. The degree of dissolution of unexposed resist is generally directly proportional to the development time.

The most widely used positive photoresists are of the naphthoquinone (1,2-) diazide sulfonic acid ester type. These photoresists are described for example in U.S. Pat. Nos. 3,046,110, 3,046,111, 3,046,112, 3,046,115, 3,046,118, 3,148,983, 3,184,310 and 3,402,044. Commercially available compositions include, in addition to the naphthoquinone diazide compounds, an alkali soluble novolac resin and other ingredients such as catalysts, sensitizers, etc., in a solvent. Positive photoresists are available from the Shipley Company, particularly AZ 1350 photoresist. In particular, AZ 1350 photoresist is a formulation containing the compound 2,4-bis(6-diazo-5,6-dihydro-5-oxo-1-naphthalenesulfonyloxy)benzophenone

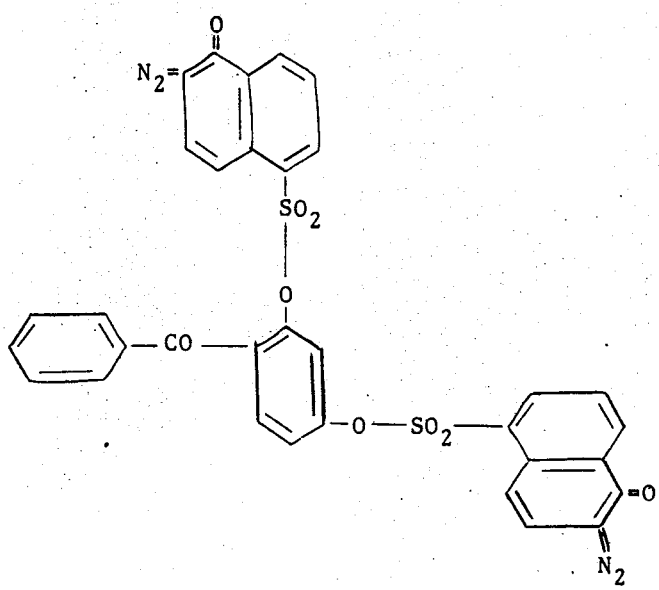

and a novalac resin. These resists are developed by a basic medium. The above compound admixed in a proportion of about 1 to 50% by weight with an alkali soluble resin produces a formulation found to be particularly sensitive to electron beams, as is disclosed in copending application of Ross and Barton, Ser. No. 332,025, filed Feb. 12, 1973 now U.S. Pat. No. 3,852,771, herein incorporated by reference.

When very thin positive resist films are employed, on the order of 0.5 micron thick films or less, the problem of dissolution of unexposed resist in the developer solvent becomes of increasing importance, particularly when development through to the substrate in the exposed area is desirable. Thus, very careful monitoring of the development process is required to preserve the maximum surface relief of the developed film. The present process provides a method of materially reducing the dissolution rate of unexposed resist during development and increasing the effective sensitivity of the resist.

SUMMARY OF THE INVENTION

According to the present process, a light or electron beam-sensitive resist film is contacted with a developer solution, washed with water and then dried prior to exposure to light or an electron beam. Development can be carried out in conventional manner. The rate of dissolution of unexposed resist in the developer solution is retarded, thereby improving the effective sensitivity of the resist.

BRIEF DESCRIPTION OF THE DRAWING

The FIGURE is a graph of trench depth of exposed and developed resist films as a function of development time.

DETAILED DESCRIPTION OF THE INVENTION

According to the present process, the unexposed resist film is contacted with a developer solution for a short interval, i.e., from about 5 to about 15 seconds, then washed with water and dried. The treated resist film is then exposed to a modulated information-containing light or electron beam and developed. Development after exposure can be single-stage or multi-stage as is disclosed in the copending Barton application referred to hereinabove. The present process materially reduces the total dissolution of unexposed resist during development, as compared to a single stage development. This result was highly unexpected and surprising.

Although the mechanism of the present process is not well understood, it is believed that contacting the resist films with the developer solution increases the wettability of the films, which are hydrophobic, such that when the resists are thereafter contacted with water, a surface reaction occurs to form a "skin" on the surface of the resist films. The treated resist film surface is less soluble in the developer solution than untreated film. This reaction, although it reduces the solubility of the resist surface in the developer solution, does not adversely affect the sensitivity of the resist to light or electron beams. Thus, the effective sensitivity of the resist film is enhanced. This is illustrated graphically in the FIGURE.

The FIGURE is a graph showing trench depth for an exposed, developed resist film as a function of development time. Curves A and B are depth measurements for exposed and unexposed resist films respectively for a resist film developed in conventional manner. If line 1 is the maximum allowable dissolution depth for unexposed resist, this amount of dissolution is reached in a certain time, $T_1$.

Curves C and D are depth measurements for exposed and unexposed resist films respectively for a resist film developed by contacting the resist film, prior to exposure to light or electron beams, with developer solution for 15 seconds followed by washing and drying. The resist is then further developed in conventional manner. The maximum allowable dissolution depth for an unexposed resist film is not reached until twice the original time, $2T_1$. Further, the effective sensitivity or the ratio between exposed and unexposed resist at $2T_1$ is increased.

The total dissolution of unexposed resist film depends not only upon the development time and history, but on the thickness of the resist film, the manner in which it is dried and the like. Since the presence of solvent in the resist film increases the rate of dissolution during development, care must be taken to ensure removal of the solvent. This can be done by air drying, baking and the like.

The invention will be further illustrated by the following examples although it is meant to be understood that the invention is not be be limited to the details described therein.

EXAMPLE 1

Part A

AZ 1350 resist available from the Shipley Company was applied as one-half micron thick films to several glass plates by spinning for 15 seconds at 4000 rpm. The plates were then immersed in AZ 1350 developer solution for varying amounts of time. Immediately after immersion, the plates were rinsed with water to halt further development, and spin dried at room temperature. The difference in thickness of the photoresist film was then noted. The results are tabulated below in Table I.

TABLE I

| Development Time, seconds | Thickness change, microns |
| --- | --- |
| 10 | 0.0250 |
| 20 | 0.0675 |
| 30 | 0.0875 |
| 40 | 0.1250 |
| 50 | 0.1850 |
| 60 | 0.1945 |

This shows that the amount of dissolution varies directly with development time for a one-step development process.

Part B

Additional plates were exposed to the developer solvent as in Part A for several short intervals, each immersion followed by rinsing with water and drying as in Part A. The results are given below in Table II.

TABLE II

| Development Cycle | Total time, seconds | Thickness change, microns |
| --- | --- | --- |
| 2 stages of 5 seconds each | 10 | 0.0140 |
| 3 stages of 10 seconds each | 30 | 0.0330 |
| 2 stages of 5 seconds each and 1 stage of 30 seconds | 40 | 0.0720 |

Comparison of the results in Tables I and II for the same total development time clearly shows that the amount of dissolution is much reduced by a staged development process.

EXAMPLE 2

Two films about 0.5 micron thick of AZ 1350 resist were applied to glass plates by spinning at 4000 rpm for 15 seconds. The films were immersed in AZ 1350 developer for 60 seconds; sample A was developed by immersing for 60 seconds continuously and sample B was developed by immersing for 10 seconds at a time with a water rinse between each immersion. The reduction in thickness of the film for sample A was 0.133 micron whereas that of sample B was only 0.021 micron.

EXAMPLE 3

Two films of AZ 1350 resist about 0.25 micron thick were applied to glass plates by diluting to 80% strength with Shipley AZ Thinner and spinning at 6000 rpm or 15 seconds. Development was as in Example 2. Sample A had a reduction in thickness of 0.137 micron whereas sample B had a reduction in thickness of only 0.076 micron.

EXAMPLE 4

AZ 1350 resist was diluted with cellusolve acetate so as to cast a resist film 3 microns thick. Films were cast onto three glass plates coated with a thin chromium-nickel alloy and air dried in a dessicator for 7 days.

Sample 1 was immersed in AZ 1350 developer for 15 seconds, rinsed with water for 10 seconds and air dried.

The three samples were exposed to the beam of a scanning electron microscope at an accelerating potential of 10 KeV and a beam current of 3nA. The Gaussian shaped beam, having a width at one-half amplitude of 0.28 micron, was scanned at a speed of 9 cm/sec. to describe fine raster patterns 1 $mm^2$.

Samples 1 and 3 were developed by immersing the exposed slides in AZ 1350 developer solution at 21°C. for 2 minutes, rinsing with water and air drying.

Sample 2 was developed in two stages; the exposed sample was immersed in the developer solution for 15 seconds, rinsed with water for 10 seconds and air dried, then reimmersed in the developer solution for an additional 1¾ minutes, rinsed with water and air dried as before.

The plates were coated with a gold film 200 angstroms thick and examined under a scanning electron microscope. The trench depth of the raster lines of the exposure was measured and the dissolution of the unexposed resist was calculated. Effective sensitivity is calculated by dividing the trench depth by the amount of dissolution, both in microns. The results are summarized below:

| Sample | Trench depth, microns | Amount of Dissolution, microns | Effective Sensitivity |
|---|---|---|---|
| 1 | 0.31 | 0.025 | 12.4 |
| 2 | 0.20 | 0.030 | 6.7 |
| 3 | 0.26 | 0.045 | 5.8 |

Thus immersing the unexposed resist film in the developer solution and washing with water prior to exposure decreases the dissolution of unexposed resist during development and increases the effective sensitivity of the resist.

We claim:
1. A process for developing a positive light and electron beam-sensitive resist film of a naphthoquinone-(1,2-)diazide sulfonic acid ester admixed with an alkali soluble resin on a support to form a surface relief pattern which consists essentially of the following steps in sequence
   a. contacting the unexposed resist film with an aqueous alkaline developer solution,
   b. washing the resist film with water,
   c. drying the film to remove the water,
   d. exposing the film to a modulated electron beam, and
   e. contacting the exposed film with the developer solution until the exposed portions of the film are partially dissolved, thereby improving the effective sensitivity of the resist.

2. A process according to claim 1 wherein the resist film comprises a mixture containing from about 1 to about 50% by weight of 2,4-bis(6-diazo-5,6-dihydro-5-oxo-1-naphthalenesulfonyloxy)benzophenone and from 99 to about 50% by weight of an alkali soluble resin.

3. A process according to claim 1 wherein step (a) is continued for from about 5 to about 15 seconds.

* * * * *